(12) United States Patent
Kuehlwein

(10) Patent No.: US 8,619,382 B2
(45) Date of Patent: Dec. 31, 2013

(54) HIGH SPEED, LOW POWER WRITE CURRENT SWITCHING SCHEME FOR HDD PREAMPLIFIER

(75) Inventor: Jeremy Robert Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/570,429

(22) Filed: Aug. 9, 2012

(65) Prior Publication Data

US 2013/0278335 A1 Oct. 24, 2013

Related U.S. Application Data

(60) Provisional application No. 61/635,975, filed on Apr. 20, 2012.

(51) Int. Cl.
*G11B 5/02* (2006.01)
(52) U.S. Cl.
USPC .......................................................... 360/67
(58) Field of Classification Search
CPC .......... H03K 19/01831; H03K 17/663; H03K 17/664
See application file for complete search history.

(56) References Cited

U.S. PATENT DOCUMENTS

| | | | |
|---|---|---|---|
| 5,126,683 A * | 6/1992 | Ishikawa et al. | 329/369 |
| 6,181,496 B1 * | 1/2001 | Price, Jr. | 360/46 |
| 7,206,155 B2 | 4/2007 | Kuehlwein et al. | |
| 7,642,819 B1 * | 1/2010 | Escobar-Bowser et al. | 327/110 |
| 7,652,466 B2 * | 1/2010 | Kimura | 324/123 R |

* cited by examiner

*Primary Examiner* — Will J Klimowicz
*Assistant Examiner* — Mark Fischer
(74) *Attorney, Agent, or Firm* — Alan A. R. Cooper; W. James Brady, III; Frederick J. Telecky, Jr.

(57) ABSTRACT

A hard drive write preamplifier includes a first differential pair of PNP BJTs having a first PNP BJT and a second PNP BJT; a first tail current source coupled into emitter of the PNP BJTs of the first differential pair; a second differential pair of NPN BJTs having a first NPN BJT and a second NPN BJT; a second tail current source coupled into the emitters of the NPN BJTs of the second differential pair; wherein a collector of each of the PNP BJTs of the first differential pair are coupled to a corresponding collector the NPN BJTs of the second differential pair; a first shift up PNP BJT having emitter coupled to the collector of a first PNP BJT of the first differential pair; a second shift up PNP BJT having an emitter coupled to the collector of the second PNP BJT of the first differential pair.

20 Claims, 5 Drawing Sheets

HIGH SPEED, LOW POWER WRITE CURRENT SWITCHING SCHEME FOR HDD PREAMPLIFIER

PRIORITY

This Application claims priority to U.S. Provisional Application No. 61/635,975, filed Apr. 20, 2012, entitled "High Speed, Low Power Write Current Switching Scheme for HDD Preamp", which is incorporated by reference in its entirety.

TECHNICAL FIELD

This Application is directed, in general, to a write current scheme for a hard disk drive ("HDD") preamplifier, and, more specifically, to a write current scheme for a HDD preamplifier having a variable slew rate and switching speed.

BACKGROUND

FIG. 1 illustrates a prior art HDD drive amplification writer circuit 100. Generally, the circuit 100 sources large switching currents (from "Iw/X", 110, 112, 150, 152, wherein "X" is ratio of an input resistor 120, 122 to a sum of output resistors 130, 132) through a resistive load 120, 122 to create the Iw reference voltage into a corresponding impedance match buffer amplifier 115, 117. In the circuit 100, current is sourced or disabled through the various current sources Iw/X, 110, 112, 150, and 152, depending upon whether it is desired to write a "1" or a "0" to a hard drive. In other words, a current can be driven through input resistors 120, 122, in opposite directions, and a voltage associated with the input resistor 120 at DC_P, and the input resistor 122 at DC_N drives inputs of the amplifiers 115, 117.

In the circuit 100, current sources 112, 150, are labeled PHI1 and current sources 110, 152 are labeled PHI2. In the circuit 100, PHI1 switching current 112 and PHI1 switching current 150 would be enabled and PHI2 switching current 110 and PHI2 switching current 152 would be disabled, or alternatively, PHI1 switching current 112 and PHI1 switching current 150 would be disabled and PHI2 switching current 110 and PHI2 switching current 152 would be enabled, whichever was preferred to write a "1" or a "0" between the write nodes 135 and 137.

However, there is a fundamental tradeoff between characteristics of a switching current, provided by current sources Iw/X 110, 112, 150, 152 and a switching speed (i.e. how quickly a transition can occur between a "1" or a "0") of the preamplifier HDD write circuit 100. In order to achieve a desired switching speed, the resistance of the input resistors 120, 122 was kept small, such as a ratio of four times the sum of the output resistors 130, 132 and the load resistance to drive the output write nodes 135, 137. Consequently, with a gain of only four times to an output write nodes 135, 137 the switching current Iw/X of the current sources 110, 112, 150, 152, then was consequently disadvantageously large to achieve the needed write current magnitude at the output write nodes 135, 137. This is a high power consumption approach. For example, for a 60 milliamp write current, a constant 15 milliwatts is being variously sourced by sources 110, 112, 150, 152. Moreover, these current sources would be switched on or off, depending upon the value desired to be written to the hard drive, which further consumed power and created transients.

Furthermore, even with employing a smaller value of a current Iw/X so as to decrease power consumption, this introduces yet other disadvantages. The resistors 120, 122 need to be larger with smaller currents Iw/X to achieve the same needed write current magnitude at the write output nodes 135, 137. The input resistors 120, 122 create an additional RC pole, along with the parasitic capacitance at a node of DC_P and DC_N, and the capacitance can be large due to large devices and large metal capacitance to support the large switching current. As the input resistors 120, 122, become larger, this RC pole becomes more dominant within the circuit 100 and slows the switching speed.

Yet still further, the switching current is "X" dependent, as the switching current is employed to be gained up/amplified by a ratio of output resistor 130 divided by input resistor 120 and output resistor 132 divided by input resistor 122 to create the output write current. These ratios not only force the switching currents to be large in order to generate a large output write current as discussed above, but also does not allow for slew rate control at the write nodes DC_P, DC_N and hence at write nodes 135, 137. It would be desirable to be able to vary the slew rate at the write nodes 135, 137. However, doing so in this architecture would also vary the output write current, which needs to remain at the same value for all slew rates.

Therefore, there is a need in the art to address at least some of the issues associated with conventional HDD controllers.

SUMMARY

A first aspect provides a hard drive write preamplifier that includes a first differential pair of PNP BJTs having a first PNP BJT and a second PNP BJT; a first tail current source coupled into the emitter of the PNP BJTs of the first differential pair; a second differential pair of NPN BJTs having a first NPN BJT and a second NPN BJT; a second tail current source coupled into the emitters of the NPN BJTs of the second differential pair; wherein a collector of each of the PNP BJTs of the first differential pair are coupled to a corresponding collector the NPN BJTs of the second differential pair; a first shift up PNP BJT having an emitter coupled to the collector of a first PNP BJT of the first differential pair; a second shift up PNP BJT having an emitter coupled to the collector of the second PNP BJT of the first differential pair; a first shift down NPN BJT having an emitter coupled to the collector of the first PNP BJT of the second differential pair; a second shift up BJT having an emitter coupled to the collector of a second PNP BJT of the second differential pair; and a first and second amplifier coupled to the emitters of the a first shift up PNP BJT and the second shift up PNP BJT.

A second aspect provides a differential pair of PNP BJTs having a first PNP BJT and a second PNP BJT; a first tail current source coupled into the emitter of the PNP BJTs of the first differential pair; a second differential pair of NPN BJTs having a first NPN BJT and a second NPN BJT; a second tail current source coupled into the emitters of the NPN BJTs of the second differential pair; wherein a collector of each of the PNP BJTs of the first differential pair are coupled to a corresponding collector the NPN BJTs of the second differential pair; a first shift up PNP BJT having an emitter coupled to the collector of a first PNP BJT of the first differential pair; a second shift up PNP BJT having an emitter coupled to the collector of the second PNP BJT of the first differential pair; a first shift down NPN BJT having an emitter coupled to the collector of the first PNP BJT of the second differential pair; a second shift up BJT having an emitter coupled to the collector of a second PNP BJT of the second differential pair; and a first and second amplifier coupled to the emitters of the a first shift up PNP BJT and the second shift up PNP BJT, a first static current source and a second static current source, an output of both of which are coupled to the base of the down shift transistor and the up shift transistor, respectively, and wherein the first static current source and the first tail current source share a node; and wherein the second static current source and the first tail current source share a node.

A third aspect provides an apparatus, comprising: a first differential pair of PNP BJTs having a first PNP BJT and a second PNP BJT; a first tail current source coupled into the emitter of the PNP BJTs of the first differential pair; a second differential pair of NPN BJTs having a first NPN BJT and a second NPN BJT; a second tail current source coupled into the emitters of the NPN BJTs of the second differential pair; wherein a collector of each of the PNP BJTs of the first differential pair are coupled to a corresponding collector the NPN BJTs of the second differential pair; a first shift up PNP BJT having an emitter coupled to the collector of a first PNP BJT of the first differential pair; a second shift up PNP BJT having an emitter coupled to the collector of the second PNP BJT of the first differential pair; a first shift down NPN BJT having an emitter coupled to the collector of the first PNP BJT of the second differential pair; a second shift up BJT having an emitter coupled to the collector of a second PNP BJT of the second differential pair; and a first and second amplifier coupled to the emitters of the a first shift up PNP BJT and the second shift up PNP BJT, a first static current source and a second static current source, an output of both of which are coupled to the base of the down shift transistor and the up shift transistor, respectively, and wherein the first static current source and the first tail current source share a node; wherein the second static current source and the first tail current source share a node; and a diode coupled to the emitter of the first downshift BJT and the base of the first upshift BJT.

BRIEF DESCRIPTION OF THE DRAWINGS

Reference is now made to the following descriptions.

DETAILED DESCRIPTION

Figure 2:
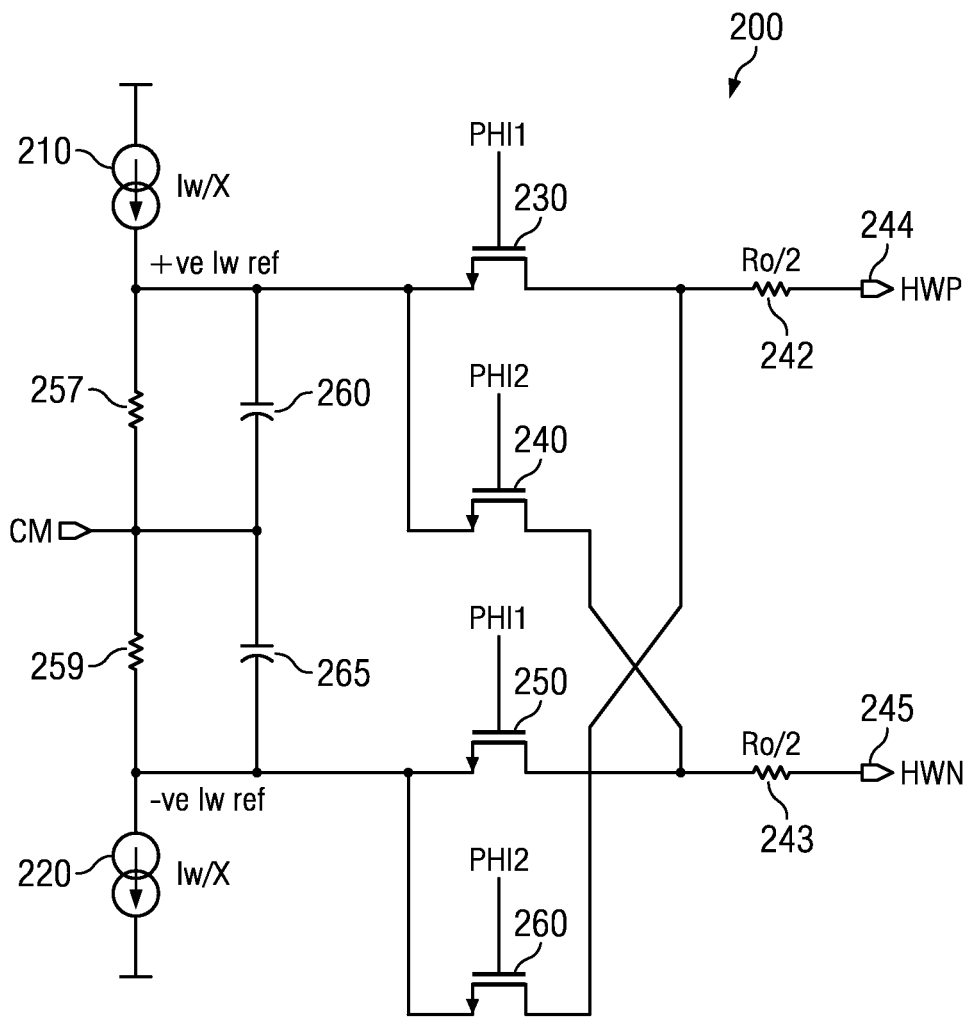
FIG. 2 illustrates a steady state HDD write preamplifer for use with Field Oxide Transistors (FETs)

Turning to FIG. 2, illustrated is one embodiment of a HDD write preamplifier with FETs ("preamplifier") 200 constructed according to the principles of the present Application.

Generally, in the write preamplifier 200, instead of having a voltage reference switching as the currents sources 110, 150 and 112, 152, are turned on or turned off, there are instead two static current sources, a static Iw/X current source 210, and a static Iw/X current source 220 that create a static positive and negative reference voltage, and generally to have switches switch coupled to them to apply a voltage to a resistor to generate a current at an output hard disk drive write positive ("HWP") write node 244, and an output hard disk drive write negative ("HWN") node 245. This can be advantageous for a number of reasons, one of which is that this avoids switching (turning on and off) the individual current sources, as shall be discussed in more detail below.

In the write preamplifier 200, FET switches 230 and 250 are a first pair of switches (PHI1), and FET switches 240 and 260 are a second pair of switches (PHI2). The PHI1 FET switches are opened or closed together, and the PHI2 FET switches are open and closed together. Moreover, the PHI1 and the PHI2 switches are in opposite states (i.e., when PHI1s are opened, the PHI2s are closed, and vice versa.) Therefore, a changeable "write" voltage appears across output resistors 242 and 243, and therefore HWP node 244 and HWN node 245.

Moreover, please note that the write preamplifier 200 includes resistors 257, 259 coupled between the current source Iw/X 210 and the current source Iw/X 220, and capacitors 260, 265 are used to stabilize circuit. Because these voltage references are static and not switching, the gain of "X" can now be much larger, which reduces power consumption, as the current sources 210, 220 can be smaller than what are found in the write preamplifier 100 and yet still drive required peak-to-peak output voltage swings.

In a further aspect, a driver, such as an AB driver, could be employed after the MOS switches 230, 240, 250, 260 to further boost the voltage; however, this would increase complexity of the preamplifier 200. Moreover, generally MOS switches are take up a large physical area, and can be slow.

Figure 1:
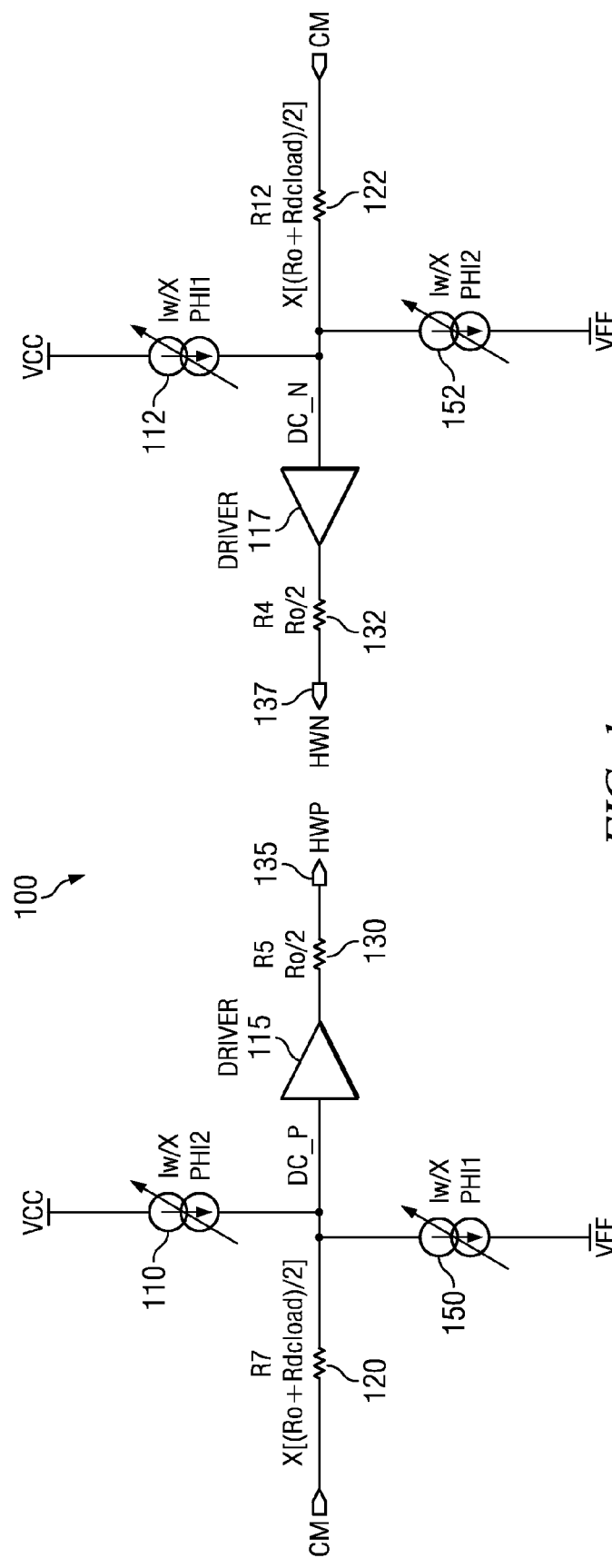
FIG. 1 illustrates a prior art HDD write preamplifier.
Figure 3:
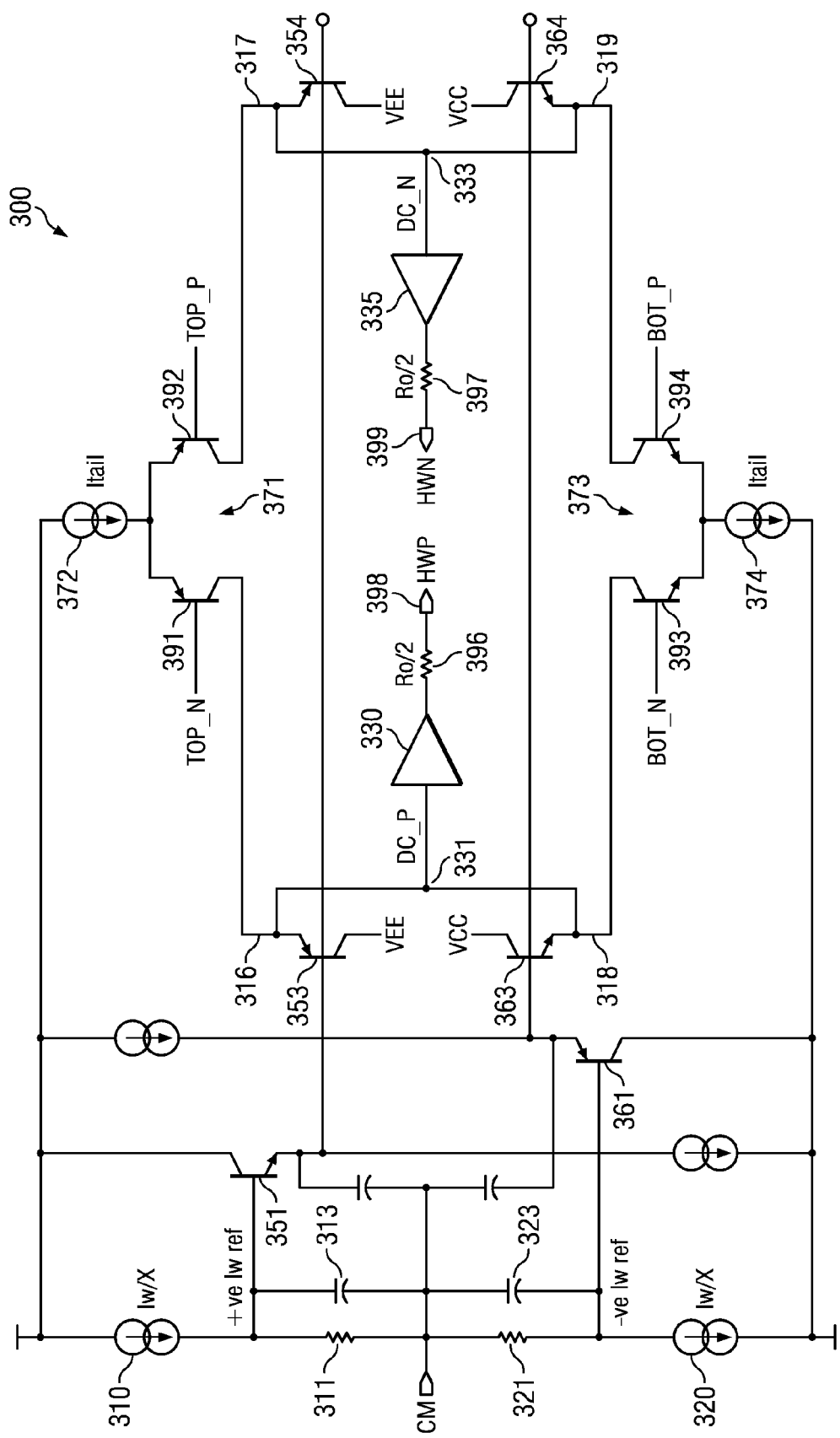
FIG. 3 is an example of a steady state HDD write preamplifer for use with Bipolar Junction Transistors (JBTs)

FIG. 3 illustrates an HDD write preamplifier circuit 300 implemented with BJTs instead of FETs. In the write preamplifier 300, instead of having enable/disable signals applied to the currents sources 110, 150 and 112, 152 of FIG. 1, there are instead two static current sources 372, 374 that are switched between DC_P, DC_N through the differential pairs 371, 373. The static current sources 310, 320 supply current that is routed through resistors 311, 321, creating the +ve Iw ref, and the −ve Iw ref. These voltages at +ve Iw ref and −ve Iw ref are further kept substantially constant through use of the capacitors 313, 323.

There is then a diode voltage drop across the base-emitter junction of BJT NPN 351 which is coupled to the base of a BJT PNP 353 and the base of a BJT PNP 354. There is also a diode voltage drop across the base-collector junction of BJT PNP 361 which is coupled to the base of a BJT NPN 363, and the base of a BJT NPN 364. There is also a diode voltage drop across the base-emitter junction of BJT PNP 353 at a node 316, which is coupled to a node 318 at the emitter of a BJT NPN 363. There is also a diode voltage drop across the base-emitter junction of BJT PNP 354 a node 317, which is coupled to a node 319 at the emitter of a BJT NPN 364.

Please note in the present Application "down shift" or "shift down" means a voltage drop or conveyed by a BJT to a further node, and an "up shift" or "shift up" means a voltage drop or conveyed by a BJT to a further node, the amount of shift being substantially a base-emitter voltage. In other words, the positive +ve Iw ref reference is level shifted down by 1 Vbe and then level shifted up 1 Vbe. The negative Iw reference is level shifted up by 1 Vbe and then level shifted down 1 Vbe.

In the write preamplifier 300, a differential pair 371 is coupled to the collector of the BJT PNPs 353, 354, and a differential pair 373 is coupled to the emitter of NPNs 363, 364. The preamplifier 300 also includes programmable tail current sources 372, 374, which provide a current for one of PNP transistors 391, 392 of differential pair 371, and NPN transistors 393, 394 of the differential pair 373, respectively.

In the write preamplifier 300, the collector of the BJT PNP 353 and the collector of BJT PNP 354 are tied to VEE, and the collector of BJT NPN 363, 364 are tied to VCC. The emitters of the positive Iw reference level BJT PNP 353 shift up and the negative BJT PNP 363 Iw reference level shift down. The emitters of BJT PNP 353 and BJT NPN 363 are tied together, such that when one level shifter/emitter follower is on of BJT 353, 363 the other is off and reversed biased. Similarly, the emitters of BJT PNP 354 and BJT NPN 364 are tied together, such that when one level shifter/emitter follower is on of BJT 354, 3634 the other is off and reversed biased.

In this fashion, the node DC_P 331 or DC_N 333, with the emitters of BJT 353 and 363 and BJT 354 and 364 tied together, switches between the positive and negative Iw reference, depending on whether current is supplied from the PNP differential pair 371 on top (base voltages TOP_N, TOP_P) or the NPN differential pair 373 on the bottom (base voltages BOT_N, BOT_P). If no current is supplied for the PNP 391 side of differential pair 371, but current is applied to the NPN 393 side of the differential pair 374, then the emitter of the BJT PNP 353 is lower than its base and is open, and the BJT 363 would be closed and node 318 and 317 would be coupled to on.

The circuit 300 can work as follows. Either TOP_N BJT 391 and BOT_N 393 are on together, or TOP_P BJT 392 and BOT_N BJT 394 are on together. In other words, TOP_P and BOT_P have a same polarity control signal applied. If TOP_N BJT 391 is on, then BJT 353 turns on and the DC_P voltage at node 316 goes up to the positive Iw reference voltage. Moreover, as BOT_N BJT 393 would be off, (these are complementary) the collector of BOT_N 393 would not sink any current.

The voltages TOP_N, TOP_P, BOT_N, BOT_P are toggled such that either DC_P 331 or DC_N 333 is brought high to the positive Iw reference received at nodes 316, 317, 318, and 319 while the other is brought low to the negative Iw reference, and vice versa. For example, if TOP_P BJT 391 is on and TOP_N BJT 392 is off and BOT_P BJT 393 is off and BOT_N BJT 394 is on, then DC_P 331 goes to the positive Iw reference and DC_N 333 goes to the negative Iw reference, with the end result that the output Iw flows from HWP to HWN though the output load. This is then toggled at high speed.

A first advantage over prior art is that the tail currents 372, 374 for the PNP and NPN differential pairs 371, 373 (base voltages TOP_N, TOP_P, BOT_N, BOT_P) are not dependent on a write current, and can therefore be sized much smaller. This lower switching current results in a lower power solution.

A second advantage is the tail current 372, 374 used for switching DC_P, DC_N can now be made programmable in order to vary the slew rate at DC_P, DC_N and ultimately at the outputs HWP 398, HWN 399. This is possible because the tail current 372, 374 is not dependent on the write current. Therefore, the tail current 372, 374 can be varied to provide the programmable rise-time feature while the output write current magnitude, provided by current sources 310, 320 as applied to the impedance matching amplifiers 330, 335 remain constant as needed.

A third advantage is that there is no longer a resistor at the DC_P, DC_N nodes as there was in the prior art. When switching, the emitter follower 353, 363, 354, 364 that was on quickly turns off and all of the switching current is used to slew parasitic capacitance, giving an I/C response, not RC. None of the slewing current is bled off by a resistor as in prior art. Furthermore, the parasitic capacitance at DC_P, DC_N is lower than prior art because the switching currents are lower. All of this results in faster switching.

Figure 4:
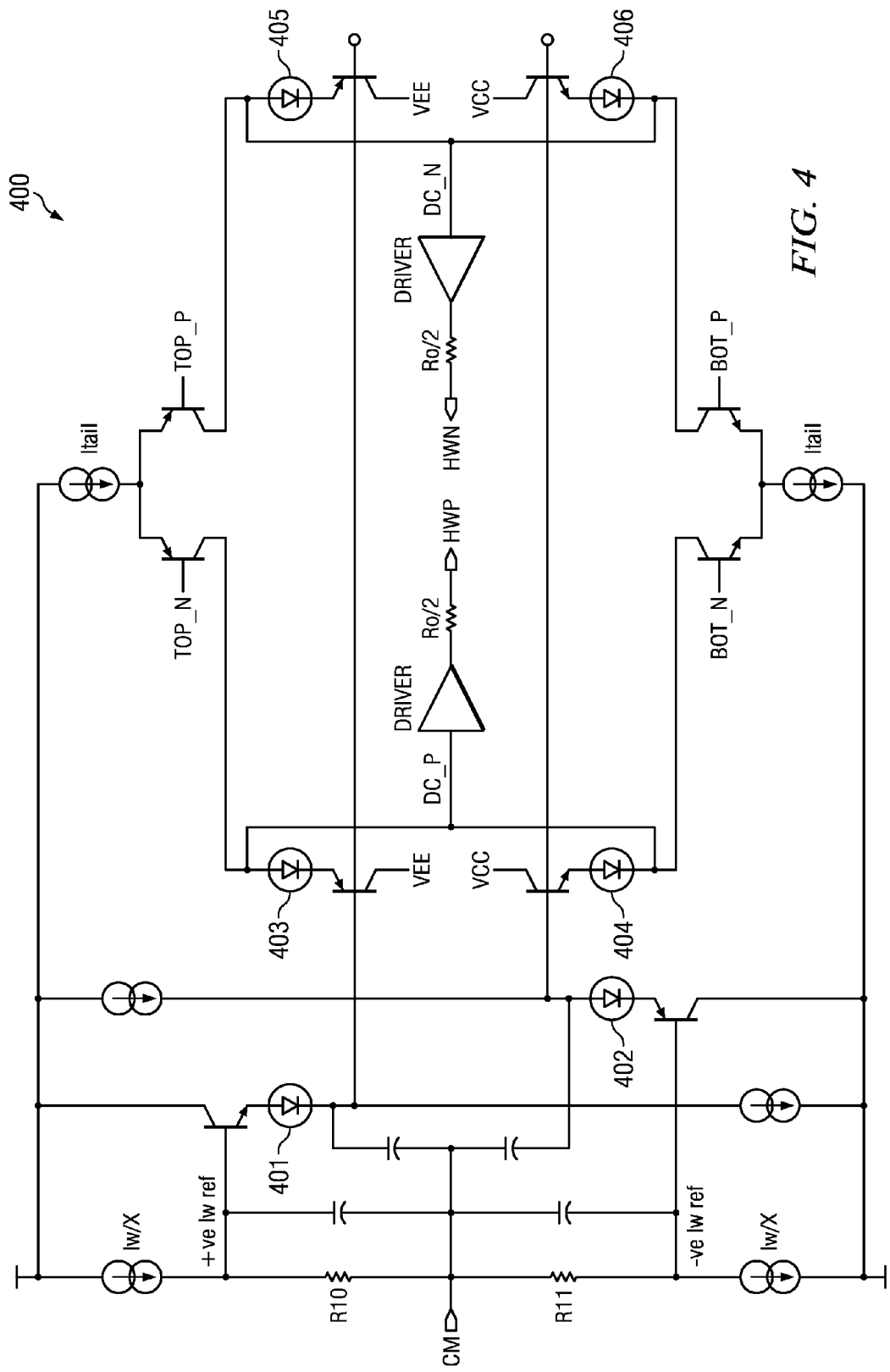
FIG. 4 is an example of a steady state HDD write preamplifer for use with BJTs and coupled protective diodes.

FIG. 4 illustrates an alternative circuit 400 for pre-amplifying an HDD signal. The amplifier 400 operates on some similar principles of the circuit of FIG. 3, and therefore shall not be described in detail. However, the circuit 400 further includes bias diodes 401-406.

As recognized by the present inventor, although the circuit 300 does offer the preceding advantages over the prior art circuit 100, the circuit 300 can depend upon various process fabrication parameters. Typically, each process will have different break down voltages, as these npns and PNPs and this here, when we are coupled one way and say that this PNP is down at the negative Iw reference, that PNP is at the top its base emitter junction is reversed biased, and that is called [21:17] the emitter-base breakdown voltage. With the circuit 300, devices 353, 363, 354, 364 experience voltages when reverse biased that exceed the emitter-base breakdown voltage for the process the circuit was designed in. By adding diodes 401-404 in circuit 400, the reverse bias voltage is reduced such that it does not exceed the emitter-base breakdown voltage. Some processes may have a higher emitter-base breakdown voltage, in which case diodes 401-404 would not be needed.

Figure 5:
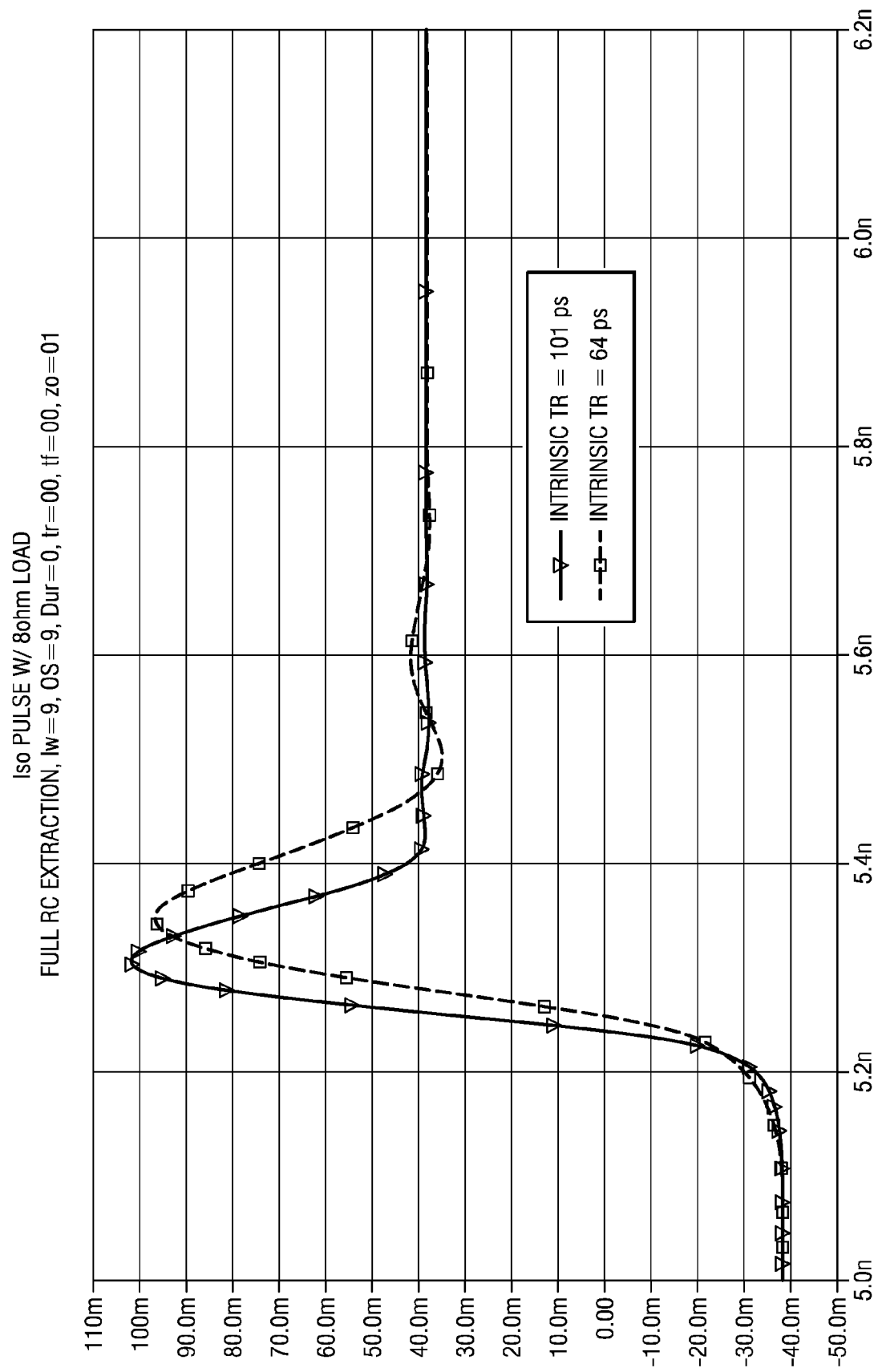
FIG. 5 is an example graph of various spikes.

FIG. 5 illustrates an impulse response when the polarity is changed from negative write current to positive write current at the outputs 398, 399, which is a current from HWP to HWN through an 8 ohm load. There is also an overshoot component on the waveform. The solid line is the circuit 300, and the dotted is the circuit 100. As is illustrated, the 10% to 90% risetime is faster at 64 picoseconds with new art vs. 101 picoseconds in prior art.

Those skilled in the art to which this application relates will appreciate that other and further additions, deletions, substitutions and modifications may be made to the described embodiments.

What is claimed is:

1. An apparatus, comprising:
   a first differential pair of PNP BJTs having a first PNP BJT and a second PNP BJT;
   a first tail current source coupled into the emitter of the PNP BJTs of the first differential pair;
   a second differential pair of NPN BJTs having a first NPN BJT and a second NPN BJT;
   a second tail current source coupled into the emitters of the NPN BJTs of the second differential pair;
   wherein a collector of each of the PNP BJTs of the first differential pair are coupled to a corresponding collector the NPN BJTs of the second differential pair;
   a first shift up PNP BJT having an emitter coupled to the collector of a first PNP BJT of the first differential pair,
   a second shift up PNP BJT having an emitter coupled to the collector of the second PNP BJT of the first differential pair;
   a first shift down NPN BJT having an emitter coupled to the collector of the first PNP BJT of the second differential pair;
   a second shift up BJT having an emitter coupled to the collector of a second PNP BJT of the second differential pair; and
   a first and second amplifier coupled to the emitters of the a first shift up PNP BJT and the second shift up PNP BJT.

2. The apparatus of claim 1, wherein the first tail source and the second tail source are programmable.

3. The apparatus of claim 1, wherein a collector of a first shift up PNP BJT is coupled to a first voltage source, and an emitter of a first shift on NPN BJT is coupled to a second voltage source.

4. The apparatus of claim 1, further comprising a first resistor coupled to an output of the first resistor, further comprising a first output resistor coupled to an output of the first output resistor, and at least a portion of a hard drive coupled between the first output resistor and the second output resistor.

5. The apparatus of claim 1, further comprising:
   a down shift transistor that has an emitter coupled to the base of the first up shift transistor, and an up shift transistor that has an emitter coupled to the base of the first down shift transistor.

6. The apparatus of claim 1, further comprising a first static current source and a second static current source, an output of both of which are coupled to the base of the down shift transistor and the up shift transistor, respectively.

7. The apparatus of claim 1, further comprising a first resistor and a second resistor coupled to an output of the first and second static current sources, and a first capacitor coupled in parallel to the first resistor, and a second capacitor coupled in parallel to the second resistor.

8. An apparatus, comprising:
  a first differential pair of PNP BJTs having a first PNP BJT and a second PNP BJT;
  a first tail current source coupled into the emitter of the PNP BJTs of the first differential pair;
  a second differential pair of NPN BJTs having a first NPN BJT and a second NPN BJT;
  a second tail current source coupled into the emitters of the NPN BJTs of the second differential pair;
  wherein a collector of each of the PNP BJTs of the first differential pair are coupled to a corresponding collector the NPN BJTs of the second differential pair;
  a first shift up PNP BJT having an emitter coupled to the collector of a first PNP BJT of the first differential pair;
  a second shift up PNP BJT having an emitter coupled to the collector of the second PNP BJT of the first differential pair;
  a first shift down NPN BJT having an emitter coupled to the collector of the first PNP BJT of the second differential pair;
  a second shift up BJT having an emitter coupled to the collector of a second PNP BJT of the second differential pair; and
  a first and second amplifier coupled to the emitters of the a first shift up PNP BJT and the second shift up PNP BJT,
  a first static current source and a second static current source, an output of both of which are coupled to the base of the down shift transistor and the up shift transistor, respectively, and
  wherein the first static current source and the first tail current source share a node; and
  wherein the second static current source and the first tail current source share a node.

9. The circuit of claim 8, wherein the first tail source and the second tail source are programmable.

10. The apparatus of claim 8, wherein a collector of a first shift up PNP BJT is coupled to a first voltage source, and an emitter of a first shift on NPN BJT is coupled to a second voltage source.

11. The apparatus of claim 8, further comprising a first resistor coupled to an output of the first resistor, further comprising a first output resistor coupled to an output of the first output resistor, and at least a portion of a hard drive coupled between the first output resistor and the second output resistor.

12. The apparatus of claim 8, further comprising:
  a down shift transistor that has an emitter coupled to the base of the first up shift transistor, and
  an up shift transistor that has an emitter coupled to the base of the first down shift transistor.

13. The apparatus of claim 8, further comprising a first resistor and a second resistor coupled to an output of the first and second static current sources, and a first capacitor coupled in parallel to the first resistor, and a second capacitor coupled in parallel to the second resistor.

14. An apparatus, comprising:
  a first differential pair of PNP BJTs having a first PNP BJT and a second PNP BJT;
  a first tail current source coupled into the emitter of the PNP BJTs of the first differential pair;
  a second differential pair of NPN BJTs having a first NPN BJT and a second NPN BJT;
  a second tail current source coupled into the emitters of the NPN BJTs of the second differential pair;
  wherein a collector of each of the PNP BJTs of the first differential pair are coupled to a corresponding collector the NPN BJTs of the second differential pair;
  a first shift up PNP BJT having an emitter coupled to the collector of a first PNP BJT of the first differential pair;
  a second shift up PNP BJT having an emitter coupled to the collector of the second PNP BJT of the first differential pair;
  a first shift down NPN BJT having an emitter coupled to the collector of the first PNP BJT of the second differential pair;
  a second shift up BJT having an emitter coupled to the collector of a second PNP BJT of the second differential pair; and
  a first and second amplifier coupled to the emitters of the a first shift up PNP BJT and the second shift up PNP BJT,
  a first static current source and a second static current source, an output of both of which are coupled to the base of the down shift transistor and the up shift transistor, respectively, and
  wherein the first static current source and the first tail current source share a node;
  wherein the second static current source and the first tail current source share a node; and
  a diode coupled to the emitter of the first downshift BJT and the base of the first upshift BJT.

15. The circuit of claim 14, further comprising a diode coupled to the collector of the first upshift BJT and the base of the first downshift BJT.

16. The circuit of claim 14, further comprising a diode coupled between an emitter of the first upshift PNP and the collector of the first PNP of the amplifier pair.

17. The circuit of claim 14, further comprising a diode coupled between an emitter of the first downshift NPNP and the collector of the first NPS of the amplifier pair.

18. The apparatus of claim 14, wherein the first tail source and the second tail source are programmable.

19. The apparatus of claim 14, wherein a collector of a first shift up PNP BJT is coupled to a first voltage source, and an emitter of a first shift on NPN BJT is coupled to a second voltage source.

20. The apparatus of claim 14, further comprising a first resistor coupled to an output of the first resistor, further comprising a first output resistor coupled to an output of the first output resistor, and at least a portion of a hard drive coupled between the first output resistor and the second output resistor.

* * * * *